Figure 1:
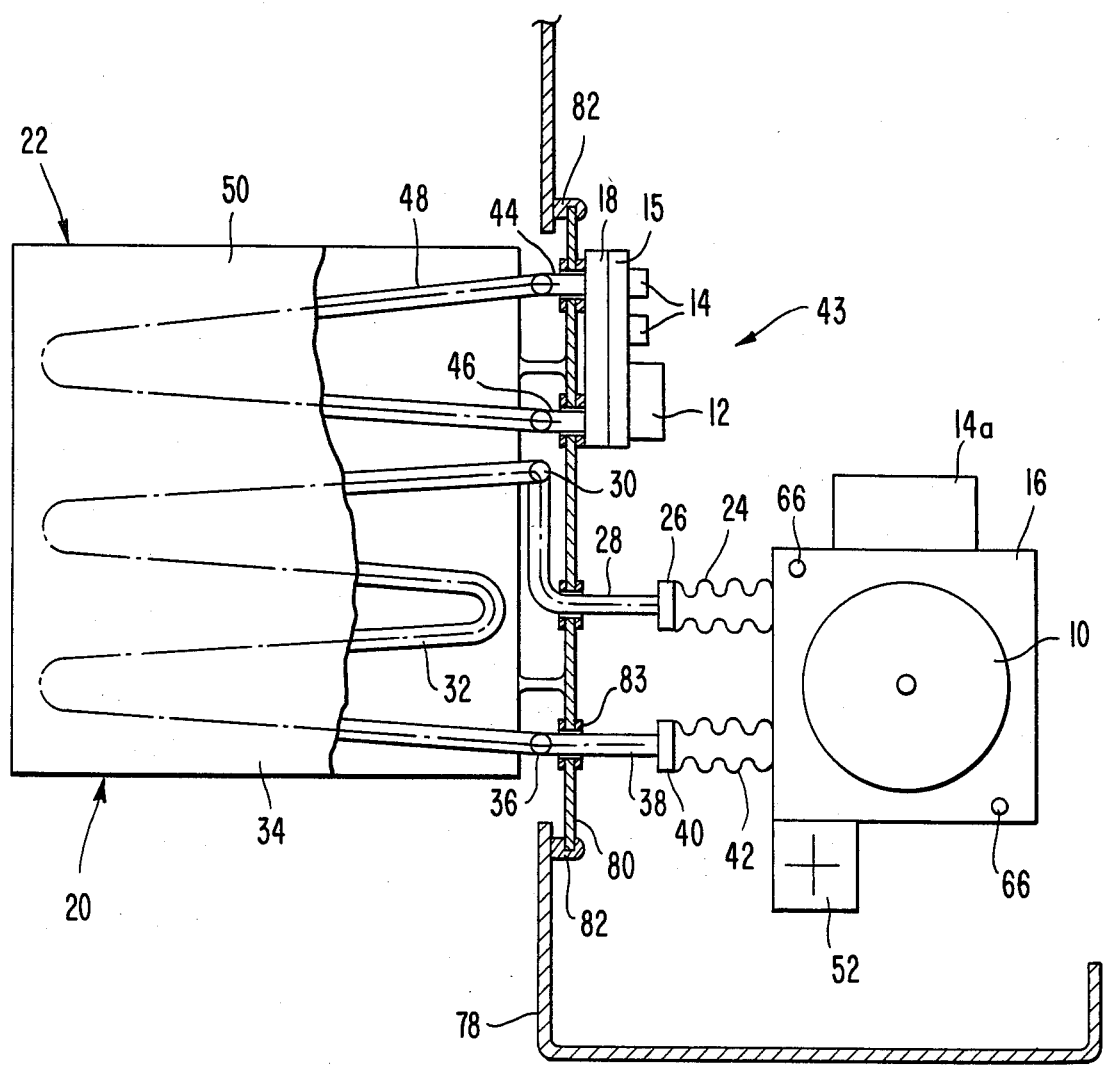

United States Patent [19]

Chauvet

[11] Patent Number: 4,733,331

[45] Date of Patent: Mar. 22, 1988

[54] HEAT DISSIPATION MECHANISM FOR POWER SEMICONDUCTOR ELEMENTS

[75] Inventor: Claude Chauvet, Sevran, France

[73] Assignee: Jeumont-Schneider Corporation, Puteaux, France

[21] Appl. No.: 908,632

[22] Filed: Sep. 18, 1986

[30] Foreign Application Priority Data

Sep. 30, 1985 [FR] France ................. 85 14419

[51] Int. Cl.⁴ ............................................. H01L 23/46
[52] U.S. Cl. ............................ 361/385; 174/15 HP; 357/82; 165/80.4; 165/80.5
[58] Field of Search ............... 165/80.2, 80.4, 80.5, 165/104.22; 174/15 R, 15 HP, 16 R; 357/82; 361/385

[56] References Cited

U.S. PATENT DOCUMENTS

| | | | |
|---|---|---|---|
| 3,989,099 | 4/1976 | Hosono et al. | 165/80 |
| 4,020,399 | 4/1977 | Suzuki et al. | 361/331 |
| 4,023,616 | 5/1977 | Scherbaum | 165/80 |
| 4,614,227 | 9/1986 | Vogel | 165/80.4 |

FOREIGN PATENT DOCUMENTS

| | | |
|---|---|---|
| 2414270 | 3/1974 | Fed. Rep. of Germany . |
| 2417106 | 4/1974 | Fed. Rep. of Germany . |
| 2544918 | 3/1984 | France . |

Primary Examiner—A. D. Pellinen
Assistant Examiner—H. L. Williams
Attorney, Agent, or Firm—Rines and Rines, Shapiro and Shapiro

[57] ABSTRACT

A power semiconductor column has power semiconductor elements arranged in alternation with thermally and electrically conductive evaporation blocks. Each evaporation block is connected in a separate heat-dissipating fluid circuit. Each fluid circuit has a heat exchanger connected to the corresponding evaporation block by way of a pair of flexible, electrically insulating fluid connections. Heat-carrying dielectric fluid circulates within each circuit between the evaporation block and the heat exchanger, cooling of the semiconductor elements being effected by evaporation of the fluid in the evaporation block and condensation of the fluid in the heat exchanger.

7 Claims, 2 Drawing Figures

HEAT DISSIPATION MECHANISM FOR POWER SEMICONDUCTOR ELEMENTS

The present invention relates in general to the dissipation of heat generated by power semiconductor elements, and more particularly envisages a heat dissipation mechanism in which a galvanic insulation of the semiconductor elements with respect to the dissipator elements is achieved.

It is well known for semiconductor elements to be pressed between two radiator elements. The radiators may be cooled by air, being directly ventilated by natural or forced convection. They may also be cooled by a system for circulation of cooling liquid. The first solution is disadvantageous in that the radiators, which are under voltage, become soiled readily, necessitating filtration of the cooling air. The solution of liquid cooling requires a pump, valves and control mechanisms.

Also familiar, especially through the German Pat. DE-OS-24 14 270, is a mechanism for cooling by evaporation, according to which the semiconductor elements are stacked alternatively with cooling chambers in which an electrically insulating coolant liquid circulates. The cooling chambers are in a closed circuit with dissipator elements. In this sort of mechanism, a portion of the cooling circuit is at the potential of the associated semiconductor or semiconductors, which is disadvantageous. Moreover, the failure of a semiconductor element requires a particularly complicated disassembly of the cooling circuit for replacement of the failed element. Further still, this type of mechanism does not enable semiconductors to be placed within a hermetic enclosure, leaving the dissipating elements in open air.

Finally, the French Pat. No. 2 544 918 discloses a cooling mechanism in which collectors of vapor and liquid are insulating, and the cooling element is galvanically insulated from the semiconductors. However, in this mechanism, the flexible linking conduit and the mounting screws are electrically conductive, and under voltage, which is again disadvantageous.

The present invention undertakes to remedy these disadvantages, and to propose a mechanism for dissipation of heat for semiconductor elements, of the type based upon evaporation/condensation of heat-carrying liquid, in which the dissipator elements in their entirety are galvanically insulated from the semiconductor elements.

It is another goal of the present invention to propose such a dissipation mechanism in which it is possible to place the semiconductor elements within a hermetic container to protect against dust, and which involves no mechanically moving component, and whose maintenance is fast and easy.

In summary, the present invention provides a heat dissipation mechanism for power semiconductor elements, unique in that it comprises, in combination:

a column including in alternation, power semiconductor elements and evaporation blocks of a good heat-conducting material, in thermic and electrical contact, these blocks additionally being provided with means of electrical connection;

means of heat exchange associated with each respective evaporation block, including cooling vanes;

two means of fluid connection extending between each evaporation block and the means of heat exchange, each including an electrically insulating portion, and a portion of flexible metal, and a dielectric heat-carrying fluid, ensuring dissipation of the heat generated by the semiconductor elements by evaporation within each evaporation block, being conducted toward the means of heat exchange through the first connection means, condensing within the heat exchange means, and returning to the evaporation block through the second connection means.

Figure 2:
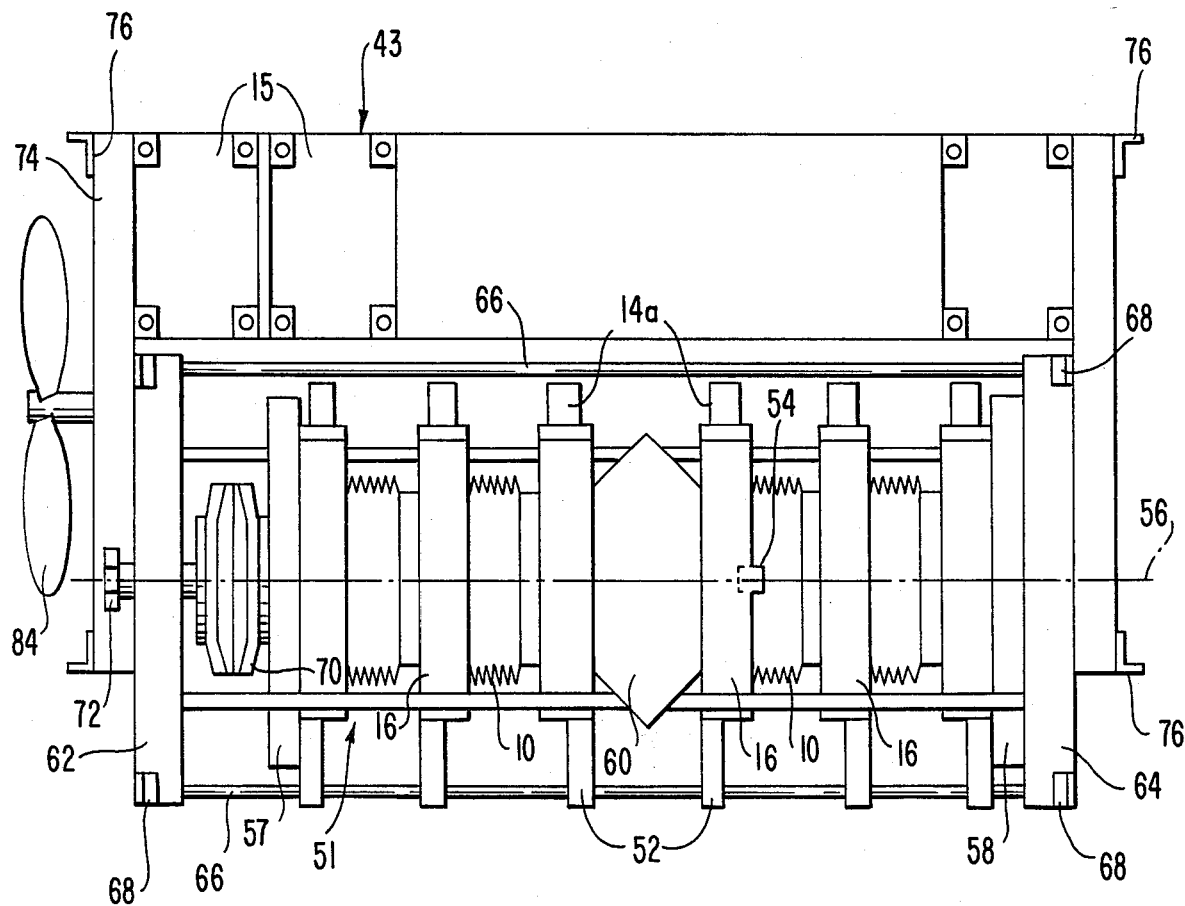

The invention will be better understood by reading the following detailed description of one preferred form of embodiment of the invention, given by way of example, with reference to the appended drawings, in which:

FIG. 1 shows a side view, partially cut away, of a dissipation mechanism according to the invention, and FIG. 2 is a front view of the mechanism of FIG. 1.

Referring to the figures, the invention is shown as applied to an electrical circuit of conventional type. The circuit includes active components, in particular power semiconductor elements 10, mounted in casings termed "power disks," and passive components, in the present case condensers 12 and protective resistances 14. In a manner well known in the field of power electronics, the semiconductor elements generate a certain amount of heat which it is necessary to remove by a cooling system, in order to keep their temperature sufficiently low that they will not be damaged or have their reliability affected. In this regard, the semiconductor elements 10 are mounted in a sandwich, and pressed between a number of first evaporation blocks 16, extending parallel to one another, essentially vertically. The blocks 16 are made of a metal with high electrical and thermic conductivity, such as copper, and include one or more interior cavities, communicating with one another and intended for the circulation of a heat-carrying fluid, as will be further described below. A film of thermic grease is placed on the electrodes of each semiconductor element 10 in contact with the evaporation blocks 16, in order to favor thermic exchange with these elements. In addition, the passive components 12, 14 are mounted on the exterior surface of a second evaporation block 18, also of copper.

The dissipation mechanism according to the invention, in addition to the evaporation blocks 16 and 18, comprises heat exchange units, generally designated as 20 and 22, respectively associated with the two cooling blocks, as described in detail below.

As is better seen in FIG. 1, each evaporation block 16 is connected to an associated heat exchange unit (dissipation element) 20 by a flexible vapor outlet tube 24, preferably of ribbed (corrugated) stainless steel, followed by an electrically insulating connective element 26, for example of glass or ceramic, and an angled tube 28 of a conductive metal such as copper. In this way, the semiconductor/evaporation block assemblies are insulated from the dissipation units 20. The tube 28 opens into a vapor collector 30 of the unit 20.

The unit 20 comprises a number of serpentine heat exchange tubes 32, preferably of copper, on which vanes 34, of an appropriate heat conducting metal such as copper or aluminum are attached, for example by brazing. In conventional fashion, the assembly can be painted black so as to augment the emissivity of the cooling surfaces, in particular in the case in which the mechanism operates with natural ventilation. The vanes are arranged vertically. A condensate collector 36 communicates with the lower ends of the tubes 32. In the same way as described above, in connection with tube 28 the condensate collector 36 is connected to the liquid inlet of the evaporation block 16, through the intermediary of a copper tube 38, an insulating connector 40 of glass or ceramic, and a flexible liquid inlet conduit 42, of ribbed stainless steel.

A conventional heat-carrying liquid, such as a fluorinated hydrocarbon, is placed within the above-described closed circuit.

In addition, each evaporation block 18 receives the passive components 12, 14 of the electronic power circuit through the intermediary of a metal plate 15, preferably of copper. There is thus realized a modular structure of passive components, each module, generally indicated as 43, being associated with one or more semiconductor element 10. Each block 18 of a passive component module 12, 14 is connected to a second associated heat exchange unit (dissipator) 22, by the intermediary of metallic tubes 44, 46, for example of copper, respectively for the outlet of vapor and inlet of liquid. The unit 22 comprises a number of serpentine conduits 48, on which are attached vanes 50 of heat-conducting material.

The structure (material chosen, mode f assembly) of the unit 22 is preferably essentially identical to that of the unit 20.

The dissipator bodies (vanes) 34 and 50 can be independent or unitary. It is preferable, however, that the body of the dissipator 34 be located below that of the dissipator 50, in order that the coolest air serves first for the cooling of the semiconductor elements 10. Indeed, the resistors 14 generally bear temperatures greater than that of the semiconductors 10, with the condensers 12, which are cool, remaining conventionally mounted near the resistors. The dissipator body 50 is thus at a higher temperature than the dissipator body 34, which favors the essential air currents of natural convection.

It may be noted here that the flexible conduits 24, 42 of ribbed stainless steel, have as their object the limiting of stresses exerted on the various tubing attachments (brazings, cementings, etc.), for reasons of reliability, especially when, to install or replace a semiconductor element 10, it is necessary to move the evaporation blocks 16 or to apply a clamping force to the semiconductor element sufficient for satisfactory transmission of heat therefrom.

According to a variation of the invention, and when the configuration permits, it is possible to mount certain passive components of the electronic power circuit, such as dynamic equalization resistors, indicated at 14a, on the evaporation blocks 16 of the semiconductor elements 10.

In FIG. 2, the assembly of the various elements of the mechanism is better represented.

Referring to this figure, the semiconductor elements 10, and the associated evaporation blocks 16, are stacked to form a column, generally indicated as 51, with the evaporation blocks also accommodating electrical connections, and bearing connection terminals as indicated at 52. The semiconductors 10 and evaporation blocks 16 are centered with respect to one another by means of centering pins 54 arranged axially in orifices (not numbered) provided for this purpose in both the opposing faces, in order to ensure correct alignment on the axis 56 of the column. Such a centering is necessary to be able to exert properly the force to clamp the elements to one another, as described below, for the purpose of ensuring good heat transfer between the semiconductor elements 10 and the evaporation blocks 16.

At the two ends of the column are provided two insulating elements 57, 58, intended for electrical insulation of the assembly.

In addition, it is possible to utilize within the column one or more intermediate insulating elements (one of which is indicated at 60), intended to electrically insulate two adjacent semiconductor elements when this is required by the wiring plan. In the case in which it is required by the heat released that the semiconductor be insulated, it is possible in addition to interpose between the semiconductors 10 and the intermediate insulation 60, evaporation blocks 16 of the type described above.

The column 51 is lodged between two end plates 62, 64, braced by threaded rods 66, themselves held by screws 68. In some cases, it is possible for the rods 66 to be provided with an insulating sheath (not represented). The attachment of the column 51 with respect to the plate 62 is effected by means of a conventional mounting element 70 associated with a screw 72.

The assembly of the mechanism is mounted on a frame 74, and fixed, for example by aid of angle irons 76, within a housing (not represented). In order to avoid overhanging of the column 51, the plates 62, 64 can be fixed to the housing by means of appropriate mounting brackets. In FIG. 1, number 78 indicates the portion of the housing where this attachment takes place. This portion 78 can be designed to be disassembled together with the assembly of the mechanism, in order to allow the assembly to be removed downward. This solution would be of particular interest in the case in which the mechanism is to be dmounted aboard a subway car.

In addition, and again with reference to FIG. 1, it is possible to provide a hermetic partition plate 80 between the components (to the right of the partition in FIG. 1) and the dissipators (to the left). Hermeticity is obtained by aid of appropriate joints 82, with pressure packings 83 being provided in the plate 80, for passage of the various metal tubes. Such an arrangement enables disposition of the set of components within a sealed region of the housing.

Finally, it is possible to equip the heat dissipation mechanism of the invention with one or more ventilators, as indicated at 84 (FIG. 2), in order to obtain satisfactory heat dissipation in a reduced volume. The ventilator or ventilators may be equipped with a thermostatic control element.

The operation of the mechanism as described above is as follows: each semiconductor 10, held between two evaporation blocks 16 and in thermic and electrical contact with them, can transmit to these blocks the heat which it generates during its operation. This delivery of heat provokes boiling of the heat-carrying liquid, and the vapor thus formed in the block is evacuated toward the heat exchange unit 20, in which it cindenses. The condensate descends by gravity into the heat exchange tubes 32, to reach the open surface of the heat-carrying fluid in liquid state (not represented). This liquid can return toward the lower region of the block through the passages 38, 40, 42 mentioned above, where it again evaporates. In this way there results a closed circuit with spontaneous circulation for a simple and effective cooling of the semiconductor elements. The dissipation elements are electrically insulated from the semiconductors, which is advantageous from the standpoint of safety, as well as for the prevention of fouling. This makes it possible in particular to connect the dissipators to the mass of the assembly, and/or to to expose them to weather. Moreover, the replacement of one or more semiconductors within the column 51 can be achieved easily, without risking breakage of the various connections (brazings, etc.) of the pipelines. Finally, the structure of the cooling mechanism according to the invention permits placement of the electronic components within an air-tight enclosure, with the associated dissipators remaining in open air. Thus, all parts under voltage are isolated.

Of course, the present invention is not limited to the mode of embodiment described, but includes within its scope various modifications that will be apparent to those skilled in the art. Thus, for example, in the case in which the semiconductor power circuit is utilized in railway traction engines, it is possible to profit from the movement of the engine to improve the movement of air over the dissipator element or elements by providing in the installation appropriate air inlets and outlets and appropriately orienting the cooling vanes.

Moreover, to form the elements of the dissipation mechanism, it is possible to utilize any metal or metal alloy having appropriate mechanical, electrical and thermic properties.

Finally, in the case in which the assembly is installed aboard a vehicle such as a railway traction engine, a quantity of heat-carrying fluid may be provided in the heat exchange circuits which is sufficient so that, if the installation is tilted or inclined, and/or subjected to acceleration or deceleration, the supply of condensate to the evaporation block is maintained.

What is claimed is:

1. A power semiconductor assembly with evaporative cooling, comprising a power semiconductor column in which power semiconductor elements are arranged in alternation and in thermal contact with evaporation blocks of good heat conducting material, each said evaporation block having a fluid inlet and a fluid outlet and being connected in a corresponding heat-dissipating fluid circuit, the corresponding fluid circuits of said evaporating blocks being separate from one another, each fluid circuit including respective heat exchange means having a fluid inlet connected to said fluid outlet of the corresponding evaporator block by way of a first flexible, electrically insulating fluid connection of that fluid circuit and a fluid outlet connected to said fluid inlet of the corresponding evaporation block by way of a second flexible, electrically insulating fluid connection of that fluid circuit, each fluid circuit containing a dielectric heat-carrying fluid which circulates between said corresponding evaporation block and said heat exchange means, the circulating fluid providing a heat dissipation effect by evaporating due to heating in said corresponding evaporation block, passing to said heat exchange means through said first connection, condensing due to cooling in said heat exchange means, and returning to said corresponding evaporation block through said second connection.

2. An assembly according to claim 1, wherein each said evaporation block hs its fluid inlet formed in a lower portion thereof and its fluid outlet formed in an upper portion thereof.

3. An assembly according to claim 1, wherein each said heat exchange means includes a serpentine tube having cooling vanes attached thereto, said tube having one end coupled to said first connection and another end coupled to said second connection.

4. An assembly according to claim 1, wherein said first and second connections each include an electrically insulating element formed of a material selected from the group consisting of glass and ceramics.

5. An assembly according to claim 1, wherein said first and second connections each include a flexible, corrugated steel tube.

6. An assembly according to claim 5, wherein said tube is formed of stainless steel.

7. An assembly according to claim 1, wherein said first and second connections each include a flexible, corrugated tube having one end connected to said evaporation block and another end connected to an electrically insulating coupling element which connects said flexible tube to said heat exchange means.

* * * * *